US006552274B1

United States Patent
Nakamura (10) Patent No.: US 6,552,274 B1
(45) Date of Patent: Apr. 22, 2003

(54) WIRE LAYING PLATE ASSEMBLY AND A MOLDING PROCESS FOR AN INSULATION PLATE

(75) Inventor: Masayoshi Nakamura, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 09/712,750

(22) Filed: Nov. 14, 2000

(30) Foreign Application Priority Data

Nov. 15, 1999 (JP) ............................................ 11-324215

(51) Int. Cl.[7] .............................................. H01B 17/26
(52) U.S. Cl. ...................... 174/151; 439/949; 174/738; 174/774
(58) Field of Search ................................ 439/949, 76.2, 439/736; 174/151, 738, 774

(56) References Cited

U.S. PATENT DOCUMENTS

| 4,194,805 | A | * | 3/1980 | Ayer et al. ................... 339/107 |
| 4,208,080 | A | * | 6/1980 | Teagno ....................... 339/18 B |
| 5,474,475 | A | * | 12/1995 | Yamaguchi ................. 439/621 |
| 5,619,071 | A | * | 4/1997 | Myers et al. ................ 257/753 |
| 5,801,335 | A | * | 9/1998 | Brussalis et al. ......... 174/138 G |
| 5,868,583 | A | * | 2/1999 | Naitou et al. .............. 439/76.2 |
| 5,888,089 | A | * | 3/1999 | Konoya et al. ............. 439/404 |
| 6,007,387 | A | * | 12/1999 | Uchiyama ................... 439/736 |
| 6,022,247 | A | * | 2/2000 | Akiyama et al. ........... 439/701 |
| 6,222,273 | B1 | * | 4/2001 | Gonzalez et al. ........... 257/774 |
| 6,244,876 | B1 | * | 6/2001 | Saka ......................... 439/76.2 |
| 6,264,510 | B1 | * | 7/2001 | Onizuka et al. ............ 439/876 |
| 6,300,676 | B1 | * | 10/2001 | Kawai ........................ 257/678 |

FOREIGN PATENT DOCUMENTS

| JP | 3150014 | 6/1991 |
| JP | 3233874 | 10/1991 |
| JP | 10-215516 | 8/1998 |
| JP | 10334958 | 12/1998 |

* cited by examiner

Primary Examiner—Dean A. Reichard
Assistant Examiner—Jinhee J Lee
(74) Attorney, Agent, or Firm—Anthony J. Casella; Gerald E. Hespos (57) ABSTRACT

A wire laying plate assembly includes a plurality of synthetic resin insulating plates (25–27). Bosses (46–48) project from at least one of the insulating plates (24–26). At least one other of the insulating plates (25–27) is formed with boss-escaping portions (55–57) for accommodating leading ends (49–51) of the bosses (46–48) formed on different insulating plates (24–26). The boss-escaping portions (55–57) gradually become deeper from their outer peripheries toward their centers. Busbars (28–31) are arranged between the insulating plates (24–27). The busbars (29–31) are formed with insertion holes (52–54). The busbars (29–31) are secured to the insulating plates (24–27) by inserting the bosses (46–48) through the insertion holes (52–54) and crimping them. In this way, a wire laying plate assembly (19) is assembled.

11 Claims, 8 Drawing Sheets

WIRE LAYING PLATE ASSEMBLY AND A MOLDING PROCESS FOR AN INSULATION PLATE

BACKGROUND OF THE INVENTION

1. Field of the Invention

The present invention relates to a wire laying plate assembly and to a molding process for molding an insulating plate for use with such a wire laying plate assembly.

2. Description of the Related Art

A prior art wire laying plate assembly is used to provide branching points for wiring, such as a wiring harness, and typically is accommodated in an electrical connection box. A typical wire laying plate assembly is identified by the numeral 71 in FIG. 6. The prior art wire laying plate assembly 71 has insulating plates 72 placed one over another and busbars 76 between the insulating plates 72. The insulating plates 72 are made of a synthetic resin, and bosses 73 project from the insulating plates 72 for crimped connection to the busbars 76. More particularly, leading ends 74 of the bosses 73 on the insulating plates 72 are accommodated in boss-escaping portions 75 formed in different insulating plates 72. Further, the busbars 76 are formed with insertion holes 77.

Figure 6:
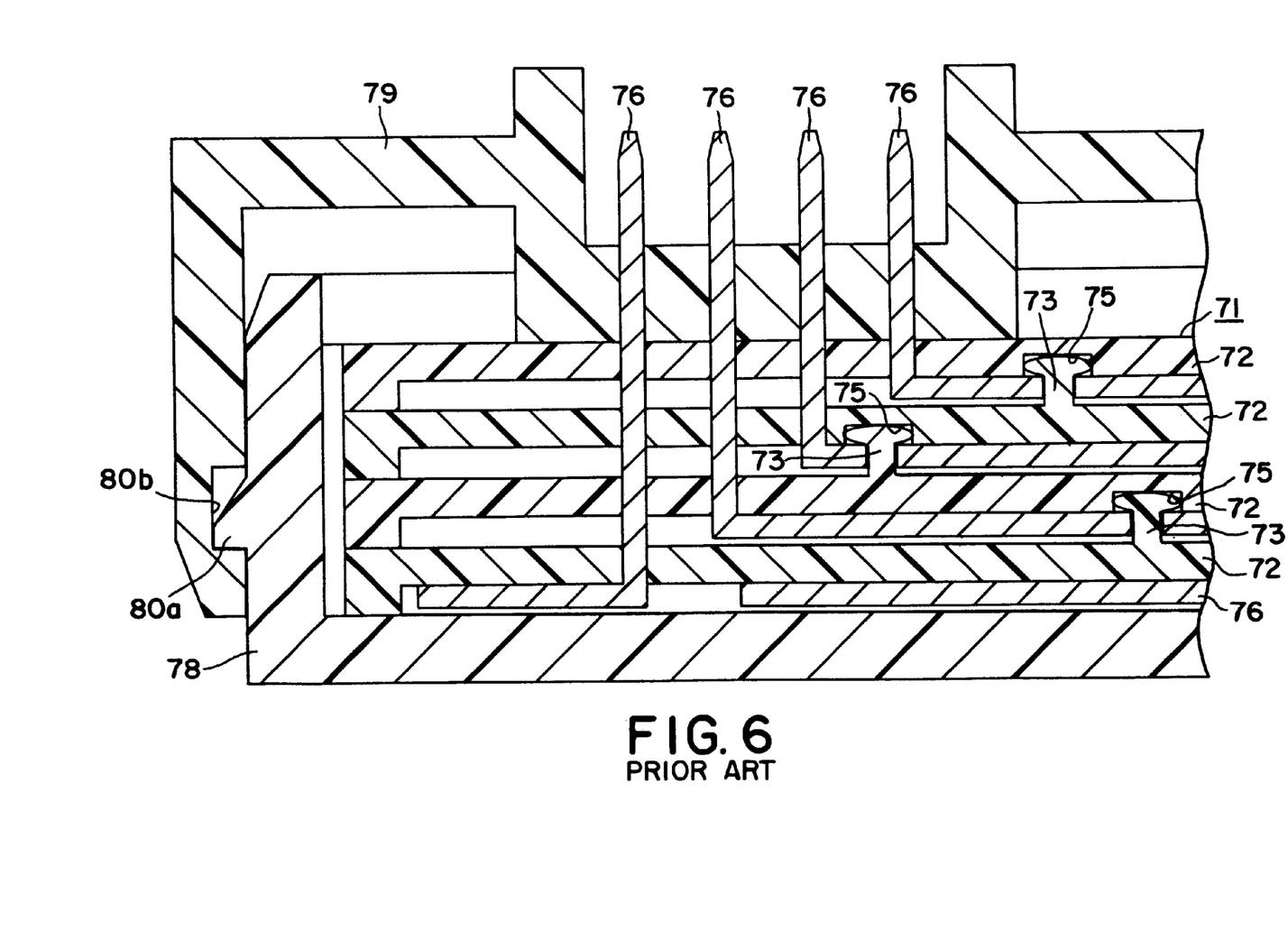
FIG. 6 is a section showing a prior art electrical connection box.

The insulating plates 72 and the busbars 76 are assembled by first inserting the bosses 73 through the insertion holes 77 in the busbars 76. The leading ends 74 of the bosses 73 then are crimped. As a result, the busbars 76 are secured to the insulating plates 72. The wire laying plate assembly 71 is formed by alternately placing the insulating plates 72 and the busbars 76.

The wire laying plate assembly 71 is accommodated in a lower casing 78. In this state, locking recesses 80b formed in an upper casing 79 are engaged with locking projections 80a provided on the lower casing 78 to fix the upper casing 79 to the lower casing 78.

Figure 7:
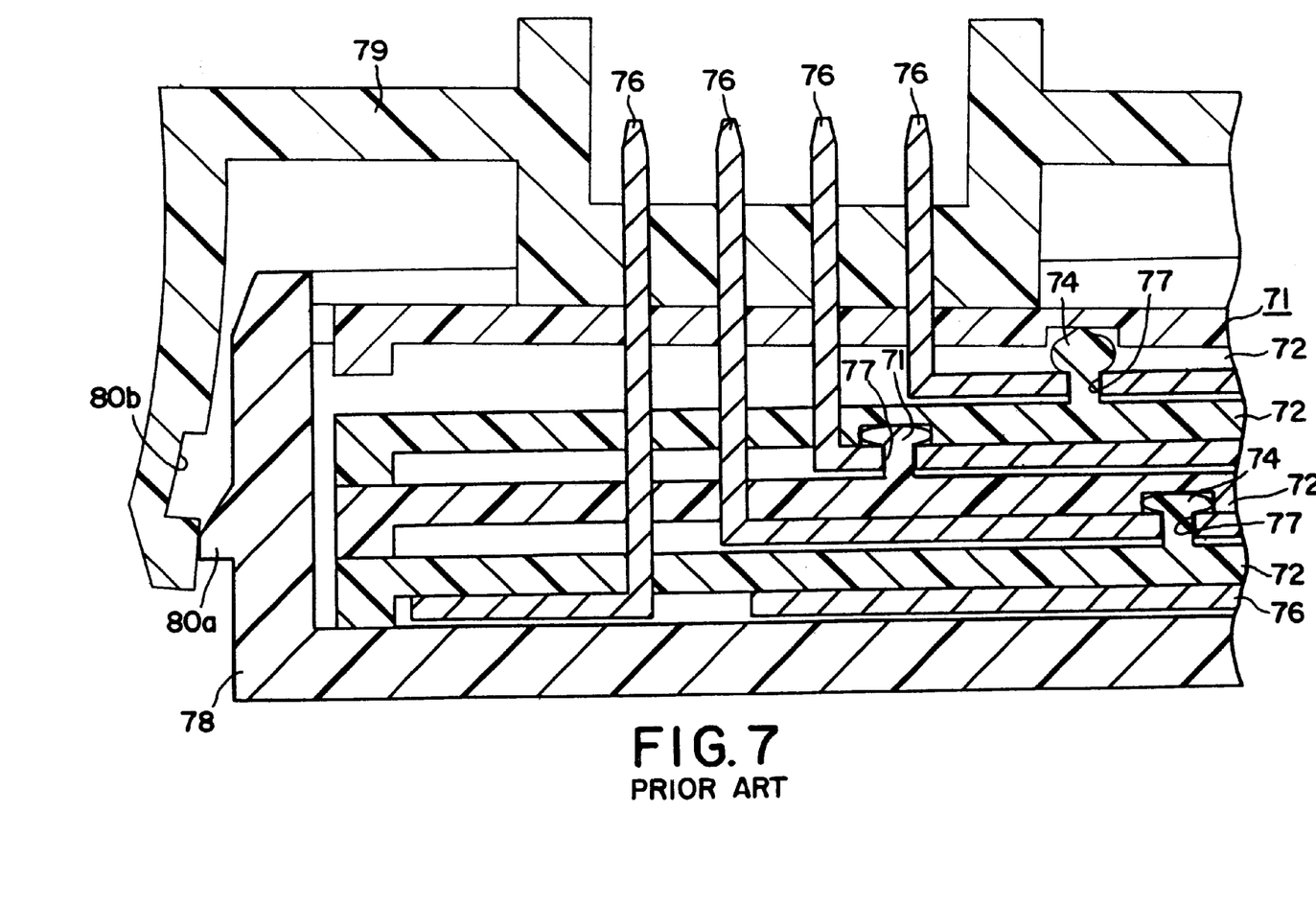
FIG. 7 is a section showing a problem of the prior art electrical connection box.

However, if the leading end 74 of the boss 73 is not crimped completely, as shown in FIG. 7, a projecting distance of the boss 73 is longer than the depth of the boss-escaping portion 75, thereby creating a problematic clearance between the insulating plate 72 and the busbar 76. Thus, a portion (tab) of the busbar 76 that projects from the upper surface of the insulating plate 72 is likely to be shorter, which causes a connection error between the busbar 76 and an unillustrated connector. Further, the upper casing 79 cannot be fitted to the lower casing 78 using the locking projections 80a and the locking recesses 80b.

Figure 8:
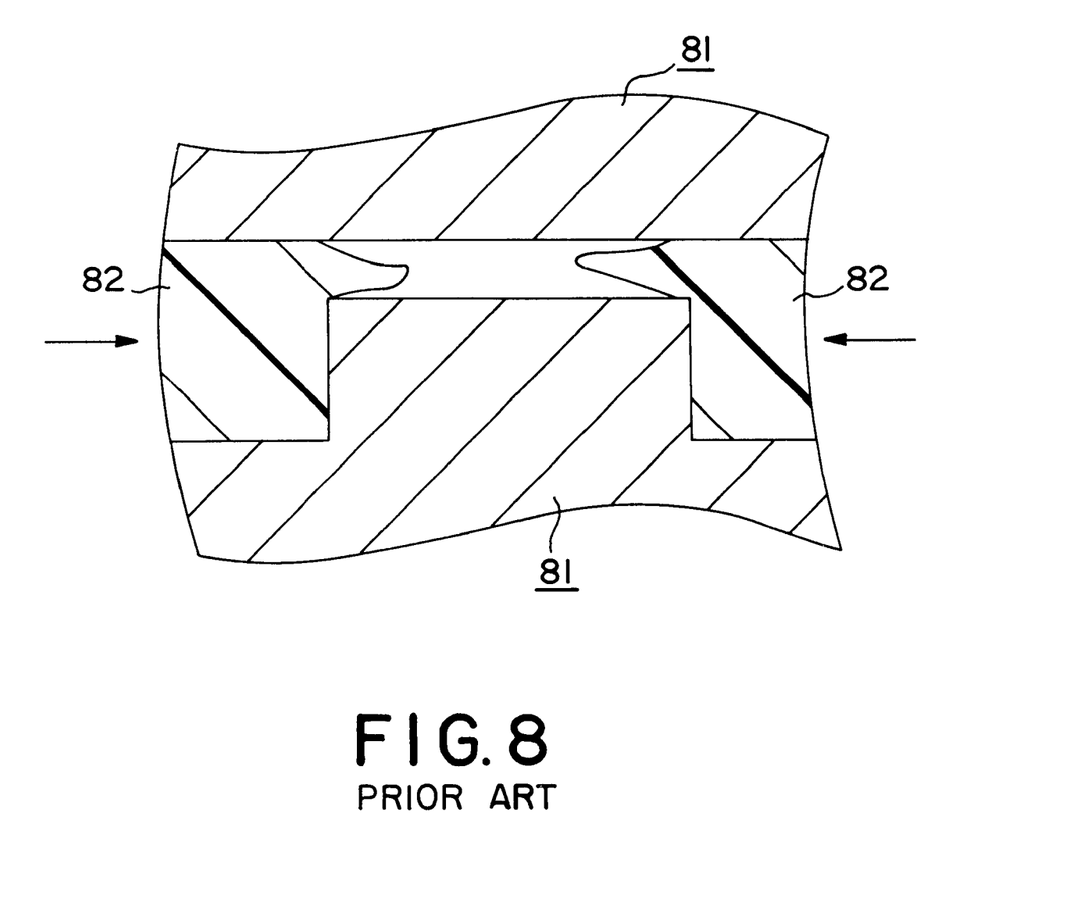
FIG. 8 is a section showing a problem when a prior art insulating plate is molded.

Attempts have been made to solve the above-described problems by deepening the boss-escaping portions 75. Such an attempt to deepen the boss-escaping portion 75 typically would be made when the resin for the insulating plate 72 is injected into a mold 81; However, the resin 82 may not fill the mold 81 completely, as shown in FIG. 8. Thus, a short shot occurs at a portion which is supposed to become the bottom of the boss-escaping portion 75, resulting in a molding error of the insulating plate 72. Accordingly, it has not been possible to ensure a sufficient depth of the boss-escaping portion 75.

Additionally the thickness of the busbars 76 is smaller than the space between the insulating plates 72. Therefore, clearances are formed between adjacent insulating plates 72 regardless of the crimped states of the leading ends 74 of the bosses 73. Such clearances cause the insulating plates 72 and the busbars 76 to shake with respect to each other, thereby creating a noise.

The present invention was developed in view of the above problems, and an object of the invention is to provide a wire laying plate assembly .that can be assembled securely by preventing a molding error of insulating plates. The invention also was developed to provide a molding process for molding an insulating plate for use with such a wire laying plate assembly.

SUMMARY OF THE INVENTION

The subject invention is directed to a wire laying plate assembly with a plurality of insulating plates. The insulating plates may be resin-molded products. At least one boss projects from a first of the insulating plates, and at least one boss-escaping portion is formed in a second of the insulating plates at a location to register with the respective boss. The boss-escaping portion is dimensioned for accommodating a leading end of the boss. Additionally, each boss-escaping portion is formed to become gradually deeper toward its center from its outer periphery. The wire laying plate assembly further comprises at least one busbar located between the first and second insulating plates. The busbar is formed with insertion holes at locations that will register with the boss. Thus, the boss of the first insulating plate can be inserted through the respective insertion hole in the busbar and into the respective boss-escaping portion of the second insulating plate to secure the busbar between the insulating plates, thereby assembling the insulating plates and the busbar.

Preferably, the first insulating plate is placed substantially on the second insulating plate with the busbar arranged between the first and second insulating plates.

The bosses preferably are crimped or deformed to secure the busbars to the insulating plates.

According to a further preferred embodiment, a wire laying plate assembly has bosses that project from a first resin-molded insulating plate. The bosses can be crimped, deformed, flattened or inserted for connection. Boss-escaping portions are formed in a second insulating plate for accommodating the leading ends of the bosses of the first insulating plate. The bosses are inserted through insertion holes formed in busbars located between adjacent insulating plates and are crimped to secure the busbars to the insulating plates, thereby assembling the insulating plates and the busbars.

The boss-escaping portions become gradually deeper toward their centers from their outer peripheries. Thus, even if deep boss-escaping portions are formed, a resin is completely filled at the bottom portions of the boss-escaping portions, thereby preventing an occurrence of a short shot during molding. Therefore, a molding error of the insulating plates can be prevented, and the wire laying plate assembly can be assembled securely.

Preferably, a tapered surface is formed at the outer periphery of the bottom surface of each boss-escaping portion. The tapered surface prevents a short shot while ensuring a sufficient depth for the boss-escaping portions. Thus, the leading ends of the bosses are fitted securely in the boss-escaping portions, and the insulating plates are held in close contact with each other. Therefore, the wire laying plate can be assembled more securely.

The insulating plates preferably are formed with recesses for at least partly accommodating the busbars. Each recesses preferably is formed with a terminal piece. The depth of each recess preferably is approximately equal to or slightly less than the thickness of the respective busbar. Accordingly, the busbars and the insulating plates are held in close contact with each other. Thus, the wire laying plate assembly can be assembled securely. Further, noise caused by shaking of the insulating plates and the busbars with respect to each other can be prevented.

The diameter of the leading ends of the bosses preferably is smaller than or substantially equal to the inner diameter of the boss escaping portions.

Most preferably, a thickness of central bottom portions of the boss-escaping portions is about ⅓ the thickness of the insulating plates, and/or a thickness of the peripheral bottom portions of the boss-escaping portion is about ⅓ to ⅔ the thickness of the insulating plates.

The invention also is directed to a process for molding an insulating plate for use with a wire laying plate assembly. The process comprises introducing a melted resin into a mold that has a projection projecting from an inner surface thereof. The resin is introduced from a side portion toward a center portion of the projection along a tapered portion inside the mold. The process then comprises substantially curing the resin inside the mold and opening the mold for withdrawing the mold insulation plate.

These and other objects, features and advantages of the present invention will become apparent upon reading of the following detailed description of preferred embodiments and accompanying drawings. It should be understood that even though embodiments are separately described, single features thereof may be combined to additional embodiments.

DETAILED DESCRIPTION OF THE PREFERRED EMBODIMENTS

Figure 1:
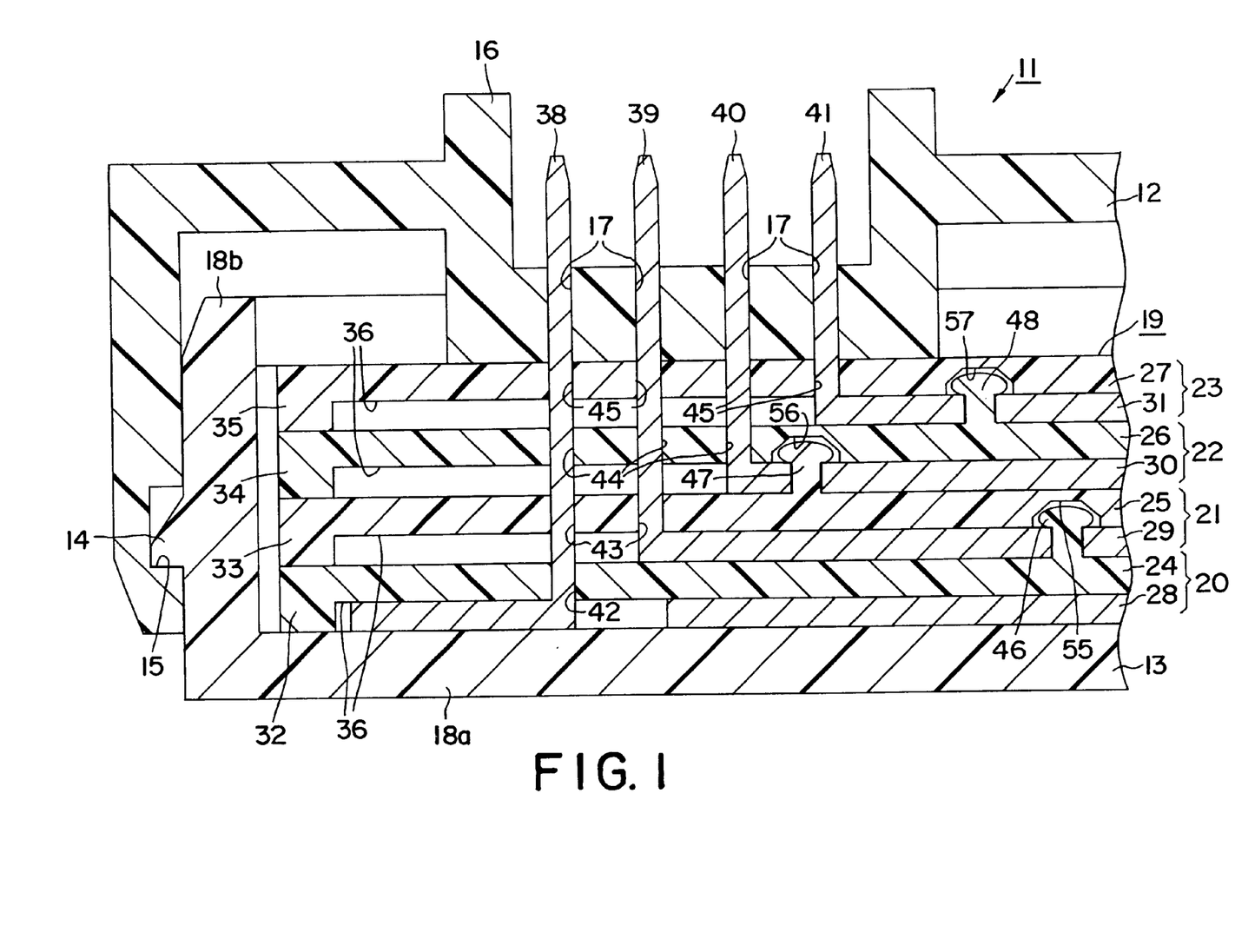
FIG. 1 is a section showing an electrical connection box accommodating a wire laying plate assembly according to one embodiment.

An electrical connection box 11, in accordance with the invention, is made e.g. of a synthetic resin, and is comprised of an upper or first casing 12 and a lower or second casing 13, as shown in FIG. 1. Locking projections 14 and locking recesses 15 are provided on the surrounding walls of the upper and lower casings 12 and 13, and can be engaged to lock the upper and lower casings 12 and 13 together.

A connector housing or receptacle 16 is formed on the upper surface of the upper casing 12. The connector housing 16 is a substantially rectangular tube with a bottom wall. Tab insertion holes 17 are formed in the bottom wall of the connector housing 16.

The lower casing 13 has a bottom portion 18a and a surrounding wall 18b. A wire laying plate assembly 19 can be accommodated at least partly in the lower casing 13, such that the wire laying plate assembly 19 is surrounded by the surrounding wall 18b. The wire laying plate assembly 19 comprises a plurality of wire laying plates 20, 21, 22 and 23 that are placed substantially one over another. The inner surface of the bottom portion 18a of the lower casing 13 at least partly supports the bottommost wire laying plate 20.

Figure 2:
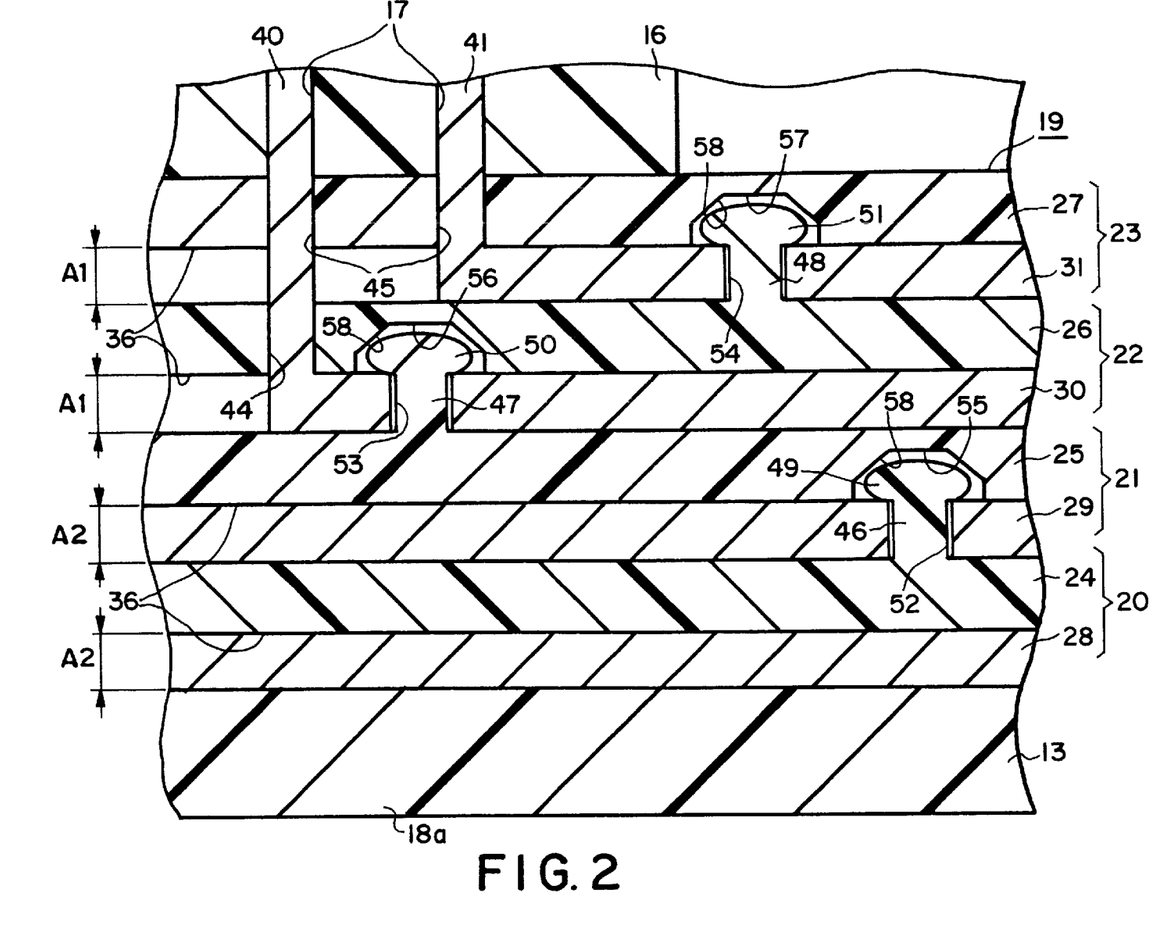
FIG. 2 is a section showing an essential portion of the electrical connection box.

As shown in FIGS. 1 and 2, the respective wire laying plates 20 to 23 comprise insulating plates 24, 25, 26 and 27, which are made, for example, of a synthetic resin material. The respective wire laying plates 20 to 23 also comprise busbars 28, 29, 30 and 31, which are made, for example, of metal plates. The busbars 28 to 31 are provided respectively on the lower surfaces of the insulating plates 24 to 27.

Insulating ribs 32, 33, 34, 35 project from the lower surface of the outer peripheries of the insulating plates 24 to 27. Recesses 36 are formed on the lower surfaces of the insulating plates 24 to 27 and are defined by the insulating ribs 32 to 35. The busbars 28 to 31 are accommodated at least partly in the respective recesses 36. As shown in FIG. 2, a depth A1 of the recesses 36 preferably is set substantially equal to a thickness A2 of the busbars 28 to 31. Therefore, the insulating plates 24 to 27 and the busbars 28 to 31 are held substantially in close contact with each other.

Tabs 38, 39, 40, 41 are formed on the respective busbars 28 to 31 and function as terminals. The tabs 38 to 41 are bent at an angle different from 0° and 90° and preferably extend substantially normally or upward in specified positions on the busbars 28 to 31. The lengths of the tabs 38 to 41 preferably are set such that their leading ends are at the substantially same height when the wire laying plates 20 to 23 are placed one over another. Thus, the tab 41 of the uppermost busbar 31 is shortest and the tab 38 of the bottommost busbar 28 is longest. The tabs 38 to 41 are inserted through a plurality of tab insertion holes 17 formed in the connector housing 16.

A through hole 42 is formed in a position on the insulating plate 24 that correspond to the tab 38. Similarly, through holes 43 are formed in positions on the insulating plate 25 that correspond to the tabs 38 and 39. In a similar manner, through holes 44 are formed in positions on the insulating plate 26 that correspond to the tabs 38 to 40, and through holes 45 are formed in positions on the insulating plate 27 that correspond to the tabs 38 to 41.

Bosses 46, 47 and 48 project from the upper surfaces of the insulating plates 24 to 26. Leading ends 49, 50 and 51 of the bosses 46 to 48 are configured to be crimped, inserted, flattened and/or deformed. The busbar 29 is formed with an insertion hole 52 substantially corresponding to the boss 46, and a boss-escaping or boss-accommodating portion 55 is formed in the lower surface of the insulating plate 25 to substantially face the leading end 49 of the boss 46. The busbar 29 is secured to the insulating plate 25 by inserting the boss 46 through the insertion hole 52 and crimping, inserting, flattening and/or deforming the leading end 49.

The busbar 30 is formed with an insertion hole 53 that substantially corresponds to the boss 47, and a boss-escaping or boss-accommodating portion 56 is formed in the lower surface of the insulating plate 26 to face the leading end 50 of the boss 47. The busbar 30 is secured to the insulating plate 26 by inserting the boss 47 through the insertion hole 53 and crimping, inserting, flattening and/or deforming the leading end 50.

Furthermore, the busbar 31 is formed with an insertion hole 54 corresponding to the boss 48, and a boss-escaping or boss-accommodating portion 57 is formed in the lower surface of the insulating plate 27 to substantially face the leading end 51 of the boss 48. The busbar 31 is secured to the insulating plate 27 by inserting the boss 48 through the insertion hole 54 and crimping, inserting, flattening and/or deforming the leading end 51.

The boss-escaping portions 55 to 57 are formed to become gradually deeper toward their centers from their outer peripheries. In other words, the depth of the boss escaping portions 55 to 57 with respect to an edge portion (i.e. a portion of the insulating plate 25–27 adjacent to the boss-escaping portions 55–57) increases when moving away from the edge portions towards the center portion.of the boss-escaping portions 55 to 57. Thus the bottom of each boss-escaping portion 55–57 has a concave shape. Accordingly, the inner walls of the boss escaping portions 55 to 57 converge towards each other in a direction to open towards the corresponding boss 46 to 48. Thus, a bottom of each.boss-escaping portion gradually becomes thinner toward its center from its outer periphery. The width of each boss-escaping portion 55 to 57 is substantially larger than the outer diameter of the bosses 46 to 48 and the depth of each boss-escaping portion 55 to 57 is larger than the height of the leading ends 49 to 51. Slanted or converging surfaces 58 are defined on the outer peripheries of the bottom surfaces of the boss-escaping portions 55 to 57. The thickness of central bottom portion of each boss escaping portion. 55 to 57 is preferably about ⅓ the thickness of the respective insulating plate 25 to 27, and the thickness of the peripheral bottom portion of each boss-escaping portion 55 to 57 is preferably about ⅓ to ⅔ the thickness of the respective insulating plate 25 to 27. The slanted surfaces 58 are inclined with respect to the bottom surfaces of the boss-escaping portions 55 to 57 by an angle different from 0° or 90° and preferably by about 45°. For these reasons a synthetic resin, or other such material, completely fills the insulating plates 25 to 27 during molding, and short shots do not occur during molding. Further, the leading ends 49 to 51 of the bosses 46 to 48 can be fitted or inserted securely in the boss-escaping portions 55 to 57, and the insulating plates 24 to 27 can be held in close contact with each other.

Accordingly, as shown in FIG. 1, the respective tabs 38 to 41 are inserted into the corresponding through holes 42 to 45, and the bosses 46 to 48 are fitted in the corresponding boss escaping portions 55 to 57. Thus, the respective layers of the wire laying plates 20 to 23 are accommodated in the lower casing 13 while being placed substantially one over another.

Figure 3A:
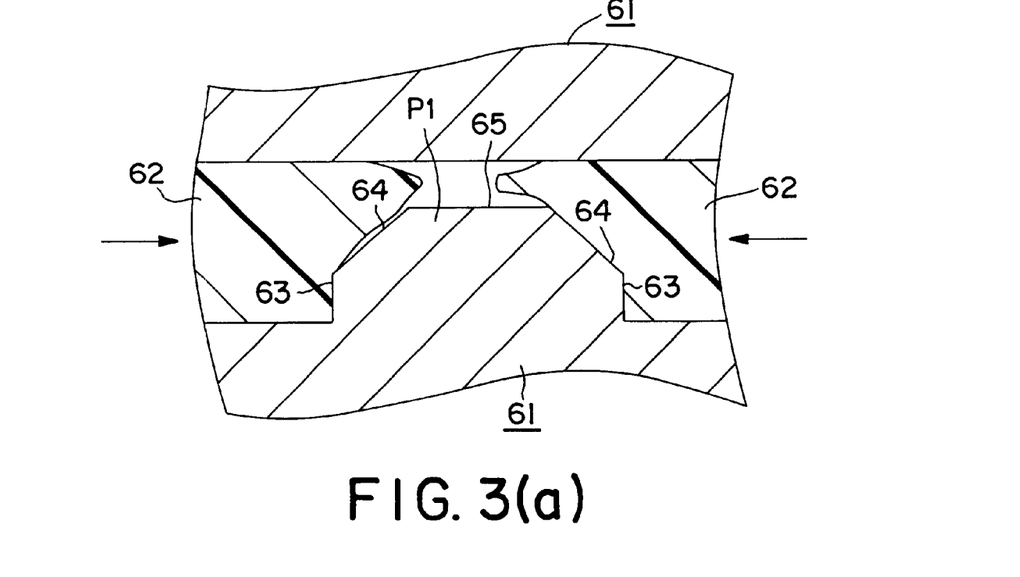
FIGS. 3(a) and 3(b) are sections showing a molding process of an insulating plate.
Figure 3B:
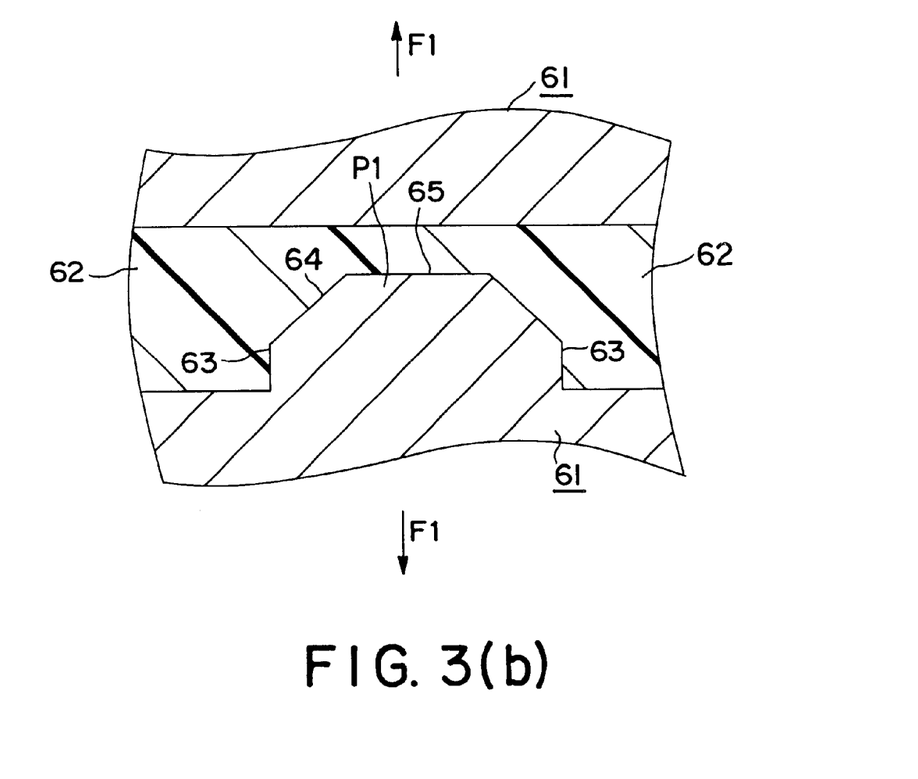

FIGS. 3(a) and 3(b) show a portion of a mold 61 into which a melted resin can be injected for molding the insulating plates 25 to 27. The mold 61 is provided with an inner surface, and a projection P1 projects from the inner surface. The projection P1 is formed with a side portion 63, a convex tapered portion 64 extending from the side portion 63, and a center portion 65 inwardly from the tapered portion 64. The resin 62 is injected smoothly into the mold 61 from the side portion 63 of the projection P1, along the tapered portion 64 and toward the center portion 65 of the projection P1. The mold 61 is filled with the resin 62, as shown in FIG. 3(b), and is left until the resin 62 is substantially cured. After the resin 62 is substantially cured, the mold 61 is opened in directions of arrows F1. As a result, the insulating plates 25 to 27 are formed of the resin 62.

The embodiment has several effects. For example, the boss-escaping portions 55 to 57 are formed to become gradually deeper from their outer peripheries toward their centers. Thus, the synthetic resin is filled completely in the mold during the molding of the insulating plates 25 to 27, thereby preventing a short shot. This can prevent a molding error of the insulating plates 25 to 27. Accordingly, the wire laying plates 20 to 23 in the respective layers can be held in close contact with each other, with the result that the wire laying plate assembly 19 can be assembled securely. At least part of the wire laying plate assembly 19 is accommodated securely in the lower casing 13. Therefore, the upper casing 12 can be mounted securely on the lower casing 13 by engaging the locking projections 14 and the locking recesses 15.

The slanted surfaces 58 are formed at the outer peripheries of the bottom surfaces of the boss escaping portions 55 to 57. Therefore, a short shot is prevented while ensuring a sufficient depth for the boss escaping portions 55 to 57. Accordingly, the leading ends 49 to 51 of the bosses 46 to 48 can be fitted securely in the boss escaping portions 55 to 57, and the insulating plates 24 to 27 can be held in close contact with each other. Thus, the wire laying plate assembly 19 can be assembled securely. Further, the slanted surfaces 58 decrease the areas of the thin portions of the insulating plates 25 to 27. As a result, a sufficient strength can be secured for the insulating plates 25 to 27.

Figure 5:
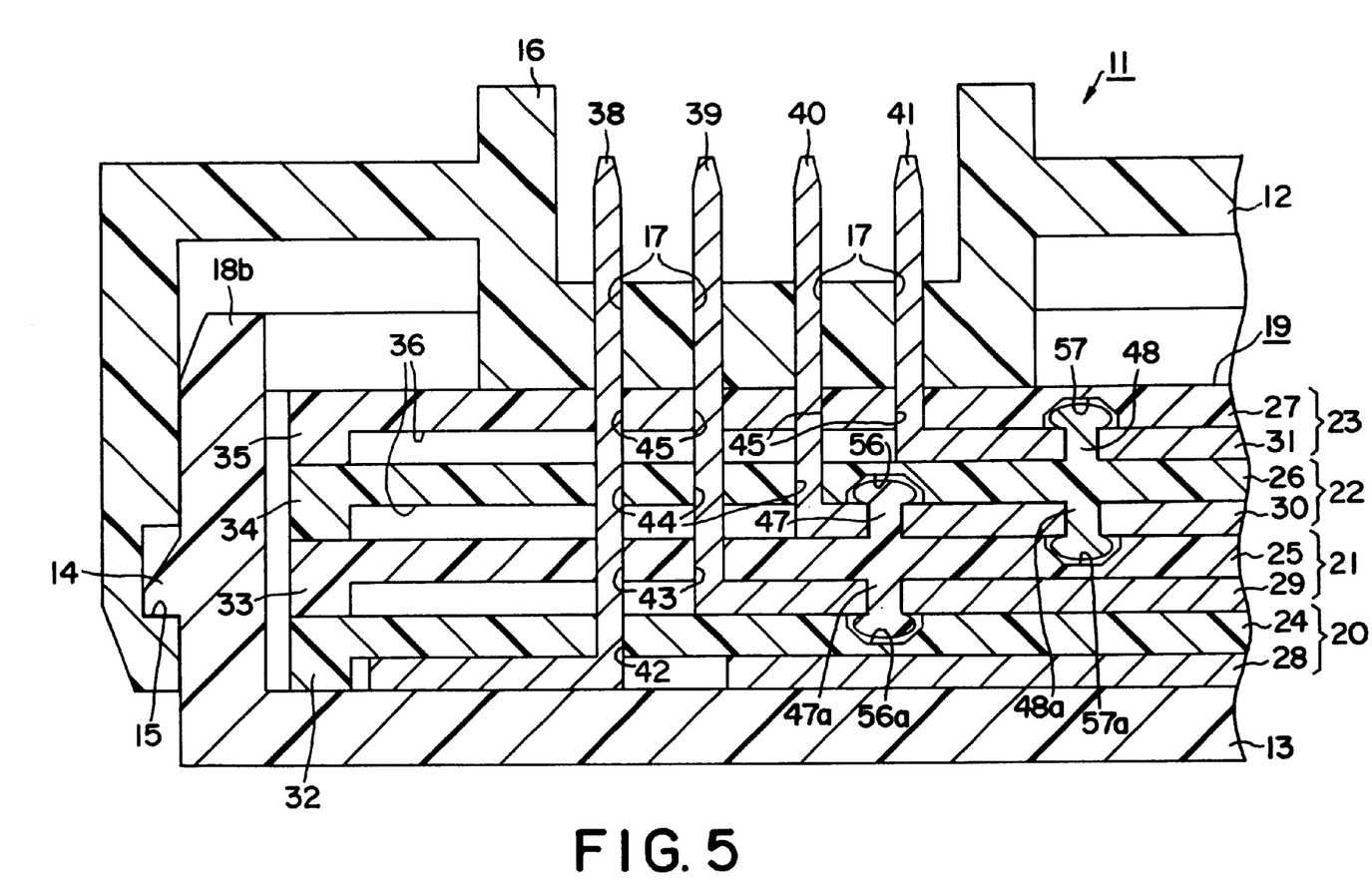
FIG. 5 is a section showing an essential portion of an electrical connection box according to still another embodiment.

The depth A1 of the recesses 36 and the thickness A2 of the busbars 28 to 31 are substantially equal. Consequently, the busbars 28 to 31 and the insulating plates 24 to 27 are held in close contact with each other in the assembled wire laying plate assembly 19, with no clearance therebetween. Thus, the wire laying plate assembly 19 can be assembled securely. Further, noise caused by shaking the insulating plates 24 to 27 and the busbars 28 to 31 can be prevented. Furthermore, the lengths of the tabs 38 to 41 that project from the connector housing 16 preferably are constantly stable, and it is unnecessary to provide a margin for the lengths of the tabs 38 to 41. Therefore, a connector can be connected securely even if the tabs 38 to 41 are shortened. In the foregoing embodiment, the bosses 46 to 48 are formed on the upper surfaces of the insulating plates 24 to 26 and the boss escaping portions 55 to 57 are formed in the lower surfaces of the insulating plates 25 to 27. However, as shown in FIG. 5, bosses 47, 47a, 48, 48a may be formed to project from the upper and lower surfaces of the insulating plates 25, 26, and boss-escaping portions 56a, 57a may be formed in the upper surfaces of the insulating plates 24, 25 while boss-escaping portions 56, 57 may be formed in the lower surfaces of the insulating plates 26, 27.

The depth A1 of the recesses 36 is substantially equal to the thickness A2 of the busbars 28 to 31 in the foregoing embodiment. However, the depth A1 of the recesses 36 may be shorter than the thickness A2. Thus, the insulating ribs 32 to 35 can be shortened, and production costs for the insulating plates 24 to 27 can be reduced.

Figure 4:
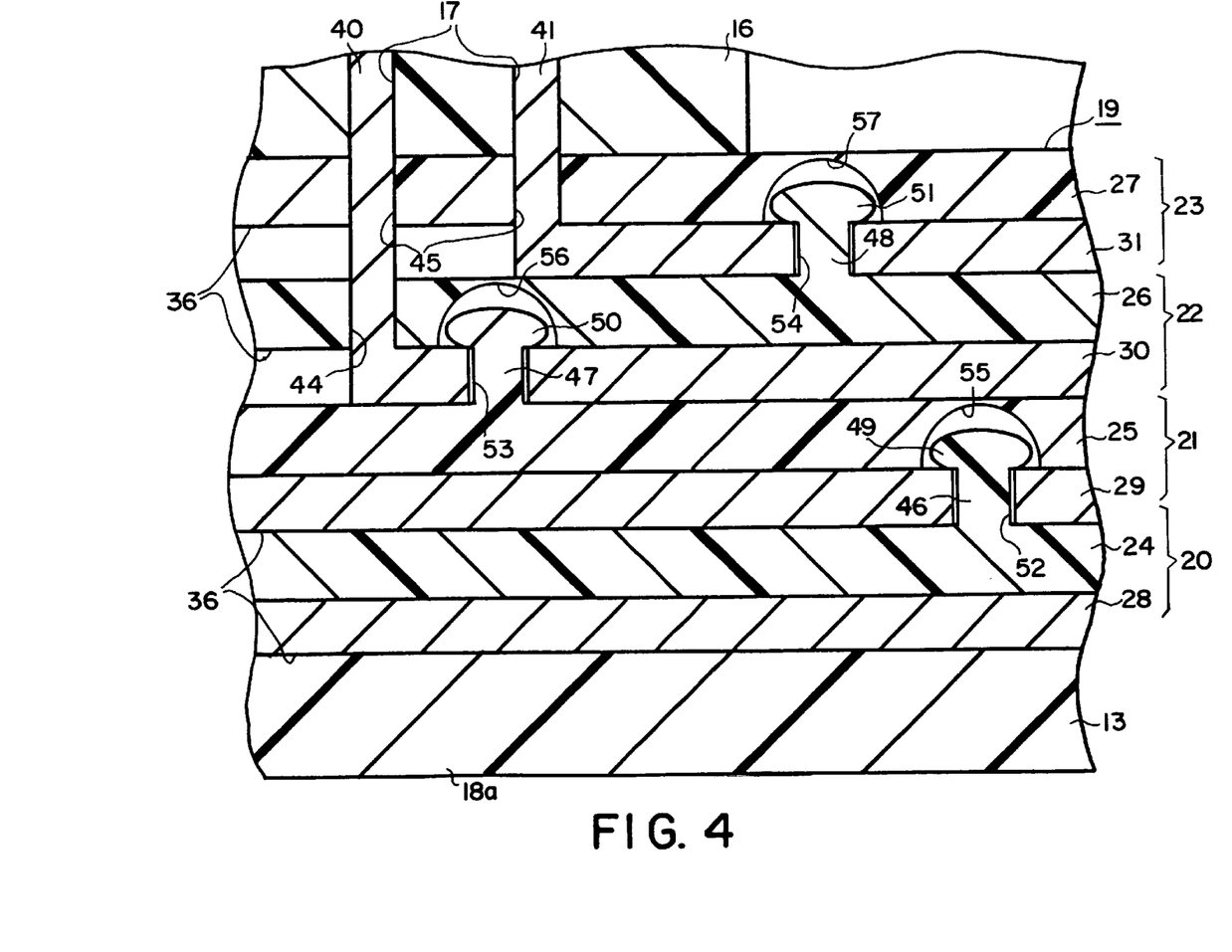
FIG. 4 is a section showing an essential portion of an electrical connection box according to another embodiment.

In the foregoing embodiment, the boss escaping portions 55 to 57 become gradually deeper toward their centers from their outer peripheries. Additionally, the tapered surfaces 58 at the outer peripheries of the bottom surfaces of the boss-escaping portions 55 to 57 have a substantially conical or frustoconical shape or shape of a truncated cone. However, as shown in FIG. 4, the boss escaping portions 55 to 57 may be formed to have a semicircular cross section. Alternatively, the boss-escaping portions 55 to 57 may be formed to have a parabolic, semielliptic, rounded or concave cross section. It is to be understood that the shape of the boss-escaping portions 55 to 57 may be either rotationally symmetric or elongated so that a correspondingly elongated center portion may be regarded as the "center" of the boss-escaping portions 55 to 57. The boss-escaping portions 55 to 57 may be either bottomed or truncated. More particularly, the recess may have rounded, slanted or converging portions 58 and a bottom portion that has substantially equal depth with respect to the edge portion. Alternatively, the recess may be completely concave, rounded or converging.

Although the diameter of the leading ends 49 to 51 of the bosses 46 to 48 is smaller than the inure diameter of the boss escaping portions 55 to 57 in the foregoing embodiment, it may be substantially equal to the inner diameter of the boss escaping portions 55 to 57. Then, the insulating plates 24 to 27 are prevented from shaking with respect to each other.

The foregoing embodiments are based on several technical concepts. For example, a wire laying plate assembly in which bosses to be crimped, deformed, inserted or flattened for connection are formed to project from insulating plates, which are e.g. resin-molded products. Boss-escaping portions for accommodating leading ends of the bosses are formed in different insulating plates placed on the former insulating plates. The bosses are inserted through insertion holes formed in busbars, which are located between adjacent insulating plates. The bosses then are crimped to secure the busbars to the insulating plates, thereby assembling the insulating plates and the busbars. A bottom portion of each boss-escaping portion gradually becomes. thinner toward its center from its outer periphery. Additionally the diameter of the leading ends of the bosses preferably is smaller than the inner diameter of the boss escaping portions.

As described in detail above, a molding error of the insulating plates can be prevented, and accordingly, the wire laying plate assembly can be assembled securely.

Furthermore, the secure assembly of the wire laying plate assembly prevents the generation of noise caused by shaking of the busbars.

What is claimed is:

1. A wire laying plate assembly comprising a plurality of insulating plates, at least one boss projecting from at least a first of said insulating plates, each said boss having a leading end, at least one boss-escaping portion being formed in at least a second of said insulating plates for accommodating the leading end of the boss, at least one busbar, the busbar being disposed between the first and second insulating plates and being formed with at least one insertion hole, the boss being inserted through insertion hole formed in the busbar and a portion of the boss external of the insertion hole being deformed to a cross-sectional dimension greater than a cross-sectional dimension of the insertion hole of the busbar for securing the busbar to the first insulating plate, the deformed portion of the boss projecting a selected distance beyond the busbar and being inserted into the boss-escaping portion of the second insulating plate thereby assembling the insulating plates and the busbar, the boss-escaping portion being formed to become gradually deeper toward its center from its outer periphery and defining a depth greater than the projecting distance of the deformed boss, the boss-escaping portion further defining a width greater than the cross-sectional dimension of the deformed boss, such that the deformed boss is loosely accommodated in the boss-escaping portion.

2. A wire laying plate assembly according to claim 1, wherein the insulating plates are resin molded products.

3. A wire laying plate assembly according to claim 1, wherein the insulating plates are placed substantially one over another with the busbar substantially arranged therebetween.

4. A wire laying plate assembly according to claim 1, wherein the boss-escaping portion is formed in a bottom surface of the second insulating plate and a tapered surface is formed at an outer periphery of said boss-escaping portion.

5. A wire laying plate assembly according to claim 1, wherein at least one of said insulating plates is formed with recess for at least partly accommodating the busbar.

6. A wire laying plate assembly according to claim 5, wherein the busbar has a thickness, and wherein the: each of the recesses has a depth that is not greater than the thickness of the busbar.

7. A wire laying plate assembly according to claim 1, wherein each said insulating plate has a thickness, the boss-escaping portion having a central bottom portion with a thickness about ⅓ the thickness of the insulating plates, the boss-escaping portion further having a peripheral bottom portion with a thickness about ⅓ to ⅔ the thickness of the insulating plates.

8. A wire laying plate assembly, comprising at least one busbar having opposite first and second surfaces and at least one insertion hole extending through the busbar from the first surface to the second surface thereof; at least first and second insulation plates, each said insulation plate having opposite first and second surfaces, the first surface of the busbar abutting the first surface of the first insulation plate and the second surface of the busbar abutting the second surface of the second insulation plate, at least one boss projecting from the first surface of the first insulation plate and passing through said insertion hole in the busbar and deformed for engaging the second surface of the busbar for holding the busbar adjacent the first surface of the first insulation plate, the second surface of the second insulation plate being formed with at least one boss-escaping portion dimensioned and disposed for loosely receiving portions of one said deformed boss projecting through the busbar so that the deformed boss is spaced from at least certain surface areas defining the boss-escaping portion, the boss-escaping portion having a concave bottom wall.

9. The wire laying plate assembly of claim 8, wherein the busbar is a first busbar, and wherein the assembly further comprises a second busbar having opposite first and second surfaces and at least one insertion hole, the first surface of the second busbar abutting the first surface of the second insulation plate, at least one boss projecting from the first surface of the second insulation plate and passing through one of the insertion holes in the second busbar, a third insulation plate having a first surface and having a second surface abutting the second surface of the second busbar, the second surface of the third insulation plate having a boss-escaping portion dimensioned and disposed for receiving portions of the boss of the second insulation plate, the boss-escaping portion having a concave bottom surface.

10. The wire laying plate assembly of claim 9, wherein the second surface of the second and third insulation plates each is formed with a recess for accommodating portions of the first and second busbars.

11. The wire laying plate assembly of claim 9, wherein each of the insulation plates has a nominal thickness at locations spaced from each said boss-escaping portion, and wherein each said boss-escaping portion has a minimum thickness of approximately ⅓ the nominal thickness.

* * * * *